United States Patent
Chan et al.

(10) Patent No.: US 6,291,312 B1
(45) Date of Patent: Sep. 18, 2001

(54) METHOD FOR FORMING PULLBACK OPENING ABOVE SHALLOW TRENC ISOLATION STRUCTURE

(75) Inventors: Bor-Wen Chan; Yuan-Hung Liu, both of Hsinchu (TW)

(73) Assignee: Taiwan Semiconductor Manufacturing Co, Ltd., Hsinchu (TW)

( * ) Notice: Subject to any disclaimer, the term of this patent is extended or adjusted under 35 U.S.C. 154(b) by 0 days.

(21) Appl. No.: 09/395,108

(22) Filed: Sep. 14, 1999

(30) Foreign Application Priority Data

Aug. 2, 1999 (TW) .............................. 88113170 A

(51) Int. Cl.⁷ .................................. H01L 21/76
(52) U.S. Cl. ......................... 438/444; 438/445
(58) Field of Search ................... 438/433, 424, 438/426, 437, 700, 717, 444, 440

(56) References Cited

U.S. PATENT DOCUMENTS

| | | | |
|---|---|---|---|
| 5,789,320 | * 8/1998 | Andricacos et al. | 438/678 |
| 6,001,707 | * 12/1999 | Lin et al. | 438/433 |
| 6,008,120 | * 12/1999 | Lee | 438/634 |
| 6,114,217 | * 9/2000 | Park | 438/424 |
| 6,146,970 | * 11/2000 | Witek et al. | 438/424 |

* cited by examiner

*Primary Examiner*—Andrew Tran
*Assistant Examiner*—Brad Smith
(74) *Attorney, Agent, or Firm*—Jiawei Huang; J.C. Patents

(57) ABSTRACT

A method for forming a pullback opening above a shallow trench isolation structure. A patterned mask layer is formed over a substrate. A sacrificial layer is formed on the sidewalls of the mask layer. The exposed portion of the substrate is etched to form a trench in the substrate. The sacrificial layer is removed to increase the width of the opening above the trench.

15 Claims, 6 Drawing Sheets

METHOD FOR FORMING PULLBACK OPENING ABOVE SHALLOW TRENC ISOLATION STRUCTURE

CROSS-REFERENCE TO RELATED APPLICATION

This application claims the priority benefit of Taiwan application serial no. 88113170, filed Aug. 2, 1999, the full disclosure of which is incorporated herein by reference.

BACKGROUND OF THE INVENTION

1. Field of the Invention

The present invention relates to a method for manufacturing a semiconductor device. More particularly, the present invention relates to a method for forming a pullback opening above a shallow trench isolation (STI) structure.

2. Description of the Related Art

Due to the rapid development of integrated circuit manufacturing techniques, highly miniaturized and integrated devices are now fabricated. As dimensions of each device shrink, isolating structures between device have to shrink correspondingly. Hence, the process of forming device isolation becomes harder. Conventionally, devices are isolated by forming a field oxide layer by a local oxidation (LOCOS) method. However, the field oxide layer is subject to bird's beak encroachment, which is a considerable barrier to device miniaturization.

In the meantime, other types of device isolation structures have also been developed. One widely adopted device isolation method, especially in the fabrication of sub-half micron integrated circuits, is shallow trench isolation (STI).

To form a conventional STI structure, a pad oxide layer and a silicon nitride mask layer are formed in sequence over a substrate. A photolithographic process is next performed to pattern out a trench region. Using a dry etching method, the silicon nitride layer, the pad oxide layer and the substrate are sequentially etched to form a trench in the substrate. A region surrounded by the trench becomes an active region where active devices are subsequently formed. Thermal oxidation is carried out to form a liner oxide layer over the interior surface of the trench. Silicon oxide is deposited into the trench and over the silicon nitride layer by chemical vapor deposition. Silicon oxide that rises above the silicon nitride layer is removed by chemical-mechanical polishing to form an isolating structure in the trench. Finally, the silicon nitride layer is removed using hot phosphoric acid solution and the pad oxide layer is removed using hydrofluoric acid solution.

In the fabrication of deep submicron devices, available space between neighboring active regions is very small. Hence, only narrow trenches can be formed. When a trench is very narrow, the gap-filling capability of the trench with respect to the deposition of silicon oxide deteriorates. Consequently, structural defects such as voids or seams are more likely to form inside the silicon oxide plug of an STI structure. Therefore, in the latest development, a 'pullback' process for widening the opening leading to the STI trench is introduced to facilitate the deposition of silicon oxide.

FIGS. 1A and 1B are schematic cross-sectional views showing a first method of manufacturing a conventional STI structure with a pullback opening. As shown in FIG. 1A, a pad oxide layer 110 and a silicon nitride layer 120 are formed in sequence over a substrate 100. Using photolithographic and etching processes, a trench 140 having an opening width of m is formed in the substrate 100. As shown in FIG. 1B, a pullback process is next carried out to widen the opening at the top of the trench 140 by performing an isotropic etching operation using hot phosphoric acid. After the etching step, the silicon nitride layer 120 surrounding the trench opening is pulled back a distance of about n, roughly equivalent to about 200 Å. Therefore, the width of the opening above the trench 140 is increased to m+2n.

FIGS. 2A and 2B are schematic cross-sectional views showing a second method of manufacturing a conventional STI structure with a pullback opening. As shown in FIG. 2A, a pad oxide layer 110, a silicon nitride layer 120 and a silicon oxide layer 130 are formed in sequence over a substrate 100. Using photolithographic and etching processes, a trench 140 having an opening width of m is formed in the substrate 100. As shown in FIG. 2B, a pullback process involving the etching of both the silicon nitride layer 120 and the silicon oxide layer 130 is next carried out to widen the opening at the top of the trench 140. The silicon nitride layer 120 and the silicon oxide layer 130 are simultaneously etched using an isotropic etching agent such as hydrofluoric acid in a glycerol or ethylene glycol (EG) solution. Ultimately, the silicon nitride layer 120 and the silicon oxide layer 130 surrounding the trench opening are pulled back a distance n, roughly equivalent to about 200 Å. Similarly, the width of the opening above the trench 140 is increased to m+2n.

Both the first and the second pullback processes depend on wet etching. However, the pullback distance n is rather difficult to control in wet etching operations because the first section of the silicon wafer clipped into the acid solution is usually the last section pulled out of the acid solution. Consequently, different areas of the wafer remain in the acid solution for different periods of time, causing the pullback distance to vary substantially across the wafer.

SUMMARY OF THE INVENTION

Accordingly, one object of the present invention is to provide a method for forming a pullback opening above a shallow trench isolation (STI) structure, in which method the pullback distance of the trench opening can be precisely controlled.

To achieve these and other advantages and in accordance with the purpose of the invention, as embodied and broadly described herein, the invention provides a method for forming a pullback opening above an STI structure. A patterned mask layer is formed over a substrate. A sacrificial layer is formed on the sidewalls of the mask layer. The exposed portion of the substrate is etched to form a trench in the substrate. The sacrificial layer is removed to increase the width of the opening above the top of the trench.

In the aforementioned process of forming a pullback opening, the sacrificial layer is formed over the sidewalls of the mask layer before etching the substrate to form a trench. Therefore, the sacrificial layer must have chemical properties different from both the mask layer and the substrate so that the sacrificial layer can be selectively removed after the trench-etching operation. In addition, the mask layer can also be a composite layer of two or more separate material layers. If a composite mask layer is formed, a staircase-like opening with increasing width will form above the top of the trench.

According to this invention, the mask layer and the sacrificial layer are used as an etching mask when the substrate is etched to form a trench. Hence, a trench having a pullback profile at the top is formed immediately after the sacrificial layer is removed. Since the pullback distance is entirely determined by thickness of the sacrificial layer, width of the pullback opening can be precisely controlled.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
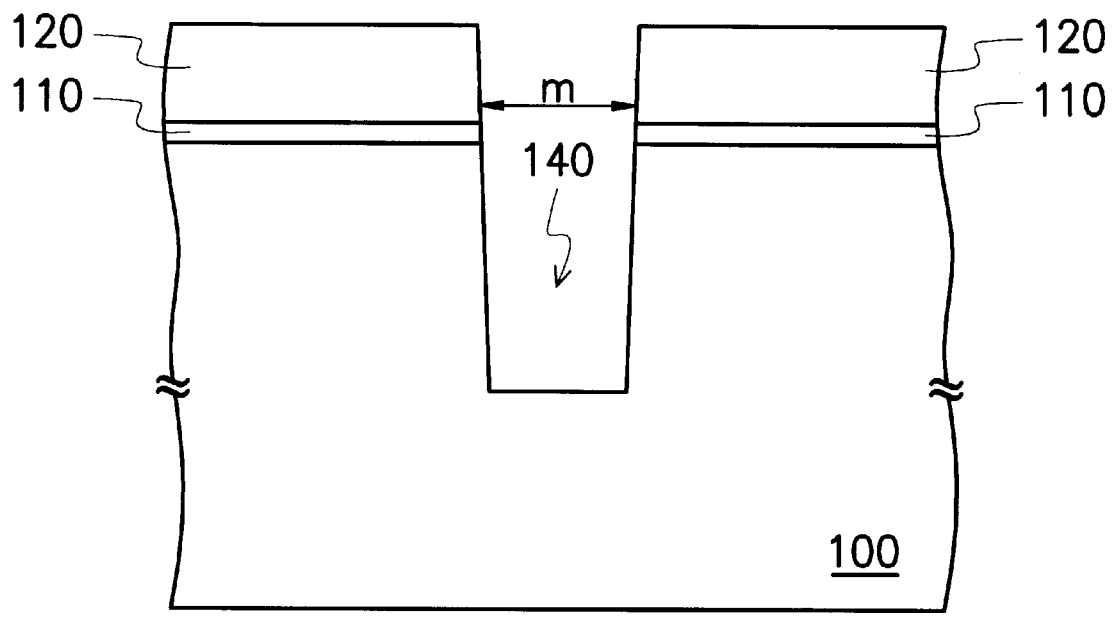
FIGS. 1A and 1B are schematic cross-sectional views showing a first method of manufacturing a conventional STI structure with a pullback opening.
Figure 1B:
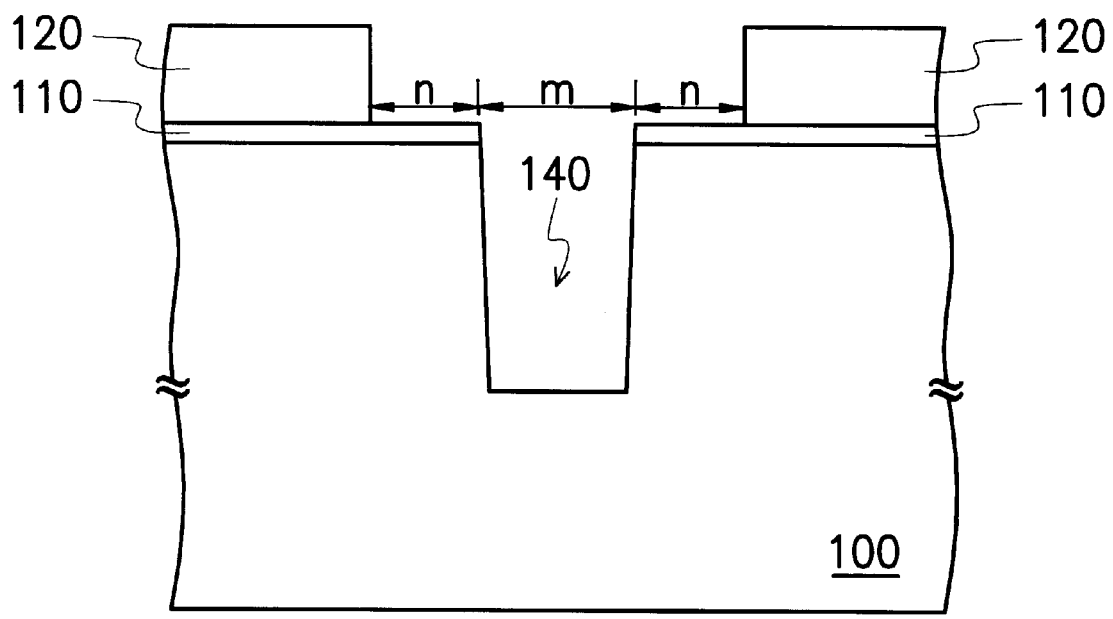
Figure 2A:
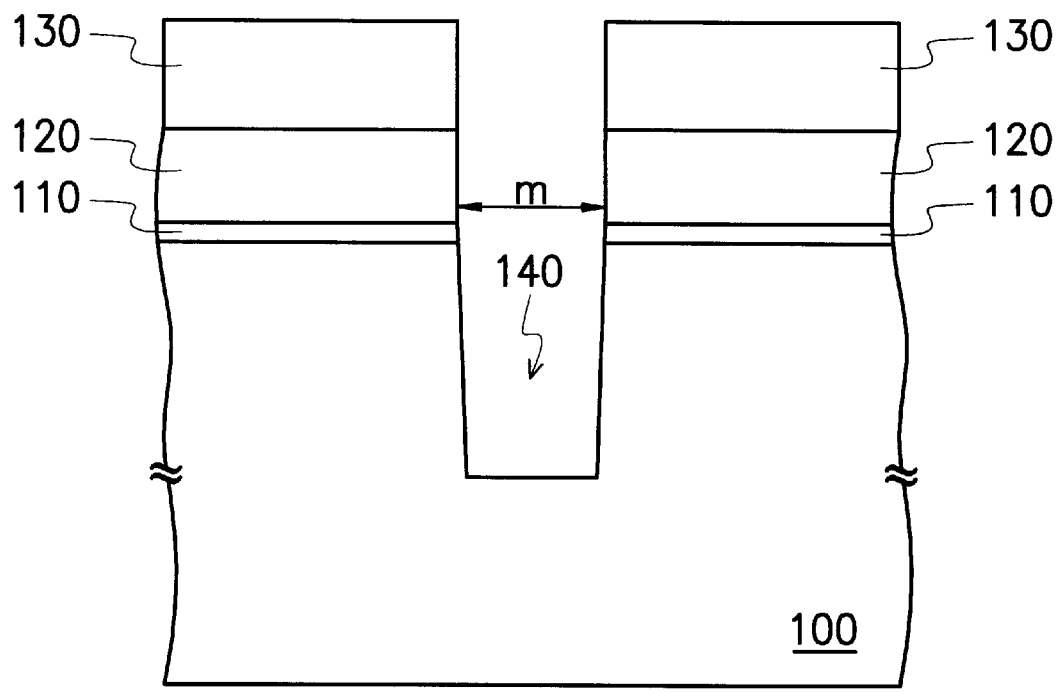
FIGS. 2A and 2B are schematic cross-sectional views showing a second method of manufacturing a conventional STI structure with a pullback opening.
Figure 2B:
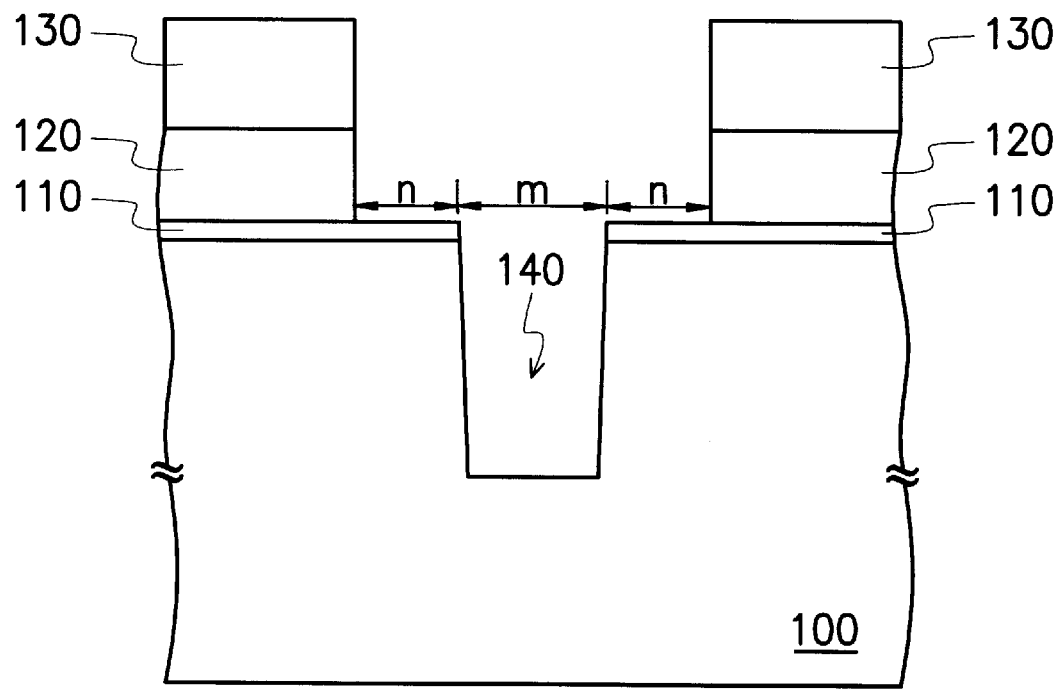

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3D are schematic cross-sectional views showing the progression of manufacturing steps for producing a pullback opening at the top of a STI trench according to a first preferred embodiment of this invention.

Figure 3A:
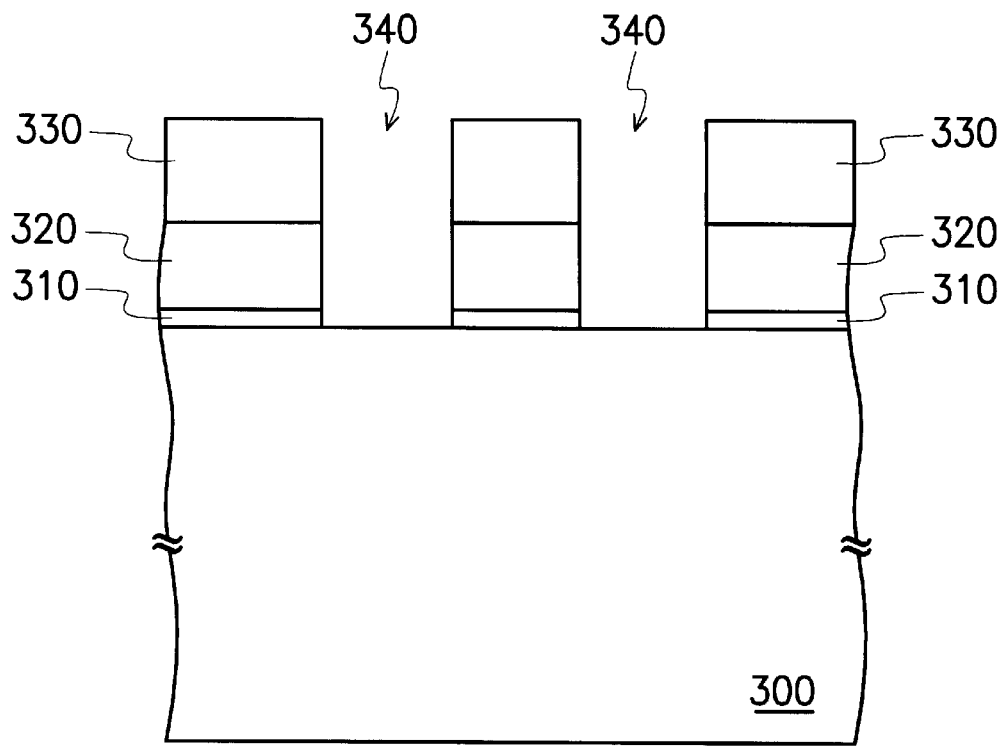
FIGS. 3A through 3D are schematic cross-sectional views showing the progression of manufacturing steps for producing a pullback opening at the top of a STI trench according to a first preferred embodiment of this invention.

As shown in FIG. 3A, a pad oxide layer 310, a first mask layer 320 and a second mask layer 330 are formed in sequence over a substrate 300. The pad oxide layer 310, the first mask layer 320 and the second mask layer 330 are patterned to form openings 340 by carrying out conventional photolithographic and etching processes.

The pad oxide layer 310 can be formed, for example, by thermal oxidation at a temperature above about 900° C. The first mask layer 320 can be a silicon nitride layer formed, for example, by low pressure chemical vapor deposition (LPCVD) carried out at a temperature of between about 700 and 800° C. using $Si_2H_2Cl_2$ and $NH_3$ as gaseous reactants. The second mask layer 330 can be a silicon oxide layer formed, for example, by LPCVD carried out at a temperature of between about 650 and 750° C. using $Si(OC_2H_5)_4$ as a gaseous reactant.

Figure 3B:
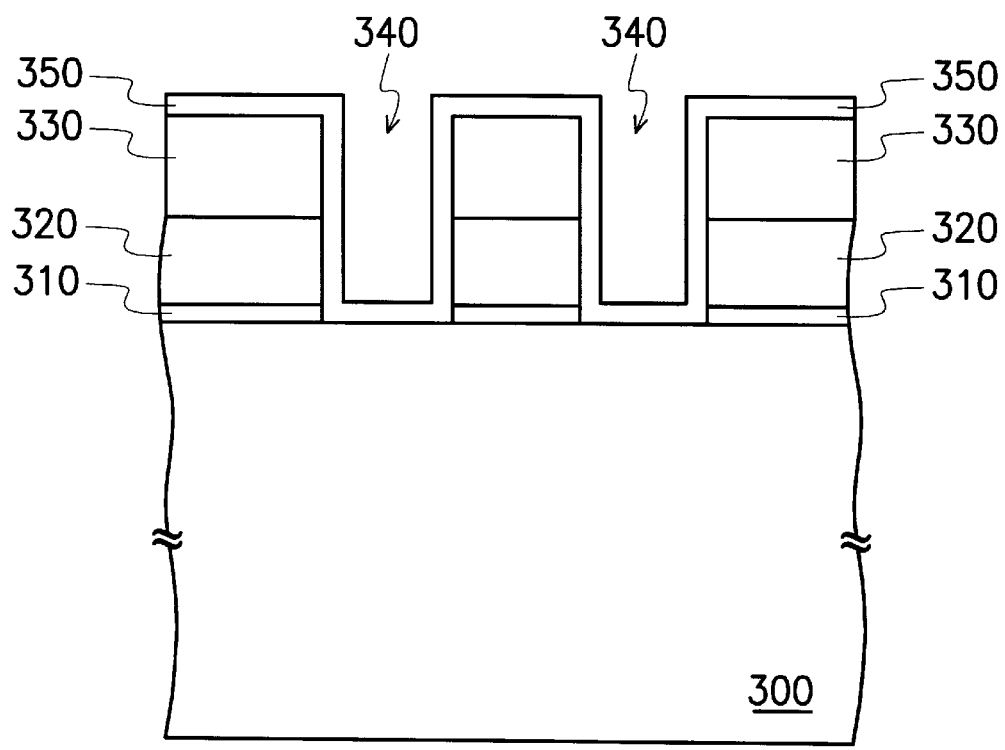

A conformal sacrificial layer 350 is formed over the exposed substrate 300, the pad oxide layer 310, the first mask layer 320 and the second mask layer 330, as shown in FIG. 3B. The sacrificial layer 350 is preferably formed using a material, such as a polymer, having chemical properties that differ from those of the substrate 300, the first mask layer 320 and the second mask layer 330. The polymeric sacrificial layer 350 is formed, for example, by inductively coupled plasma (ICP) chemical vapor deposition using difluoromethane ($CH_2F_2$) as a gaseous source. Flow rate of the difluoromethane is preferably between about 10 and 150 sccm, with some argon (Ar) added to serve as a diluent. Other parameters for carrying out the ICPCVD process include a reaction chamber pressure of between about 10 and 20 mtorrs, an ICP power of about 400 to 700 Watts and an electrode temperature of between about 0 and 40° C.

Figure 3C:
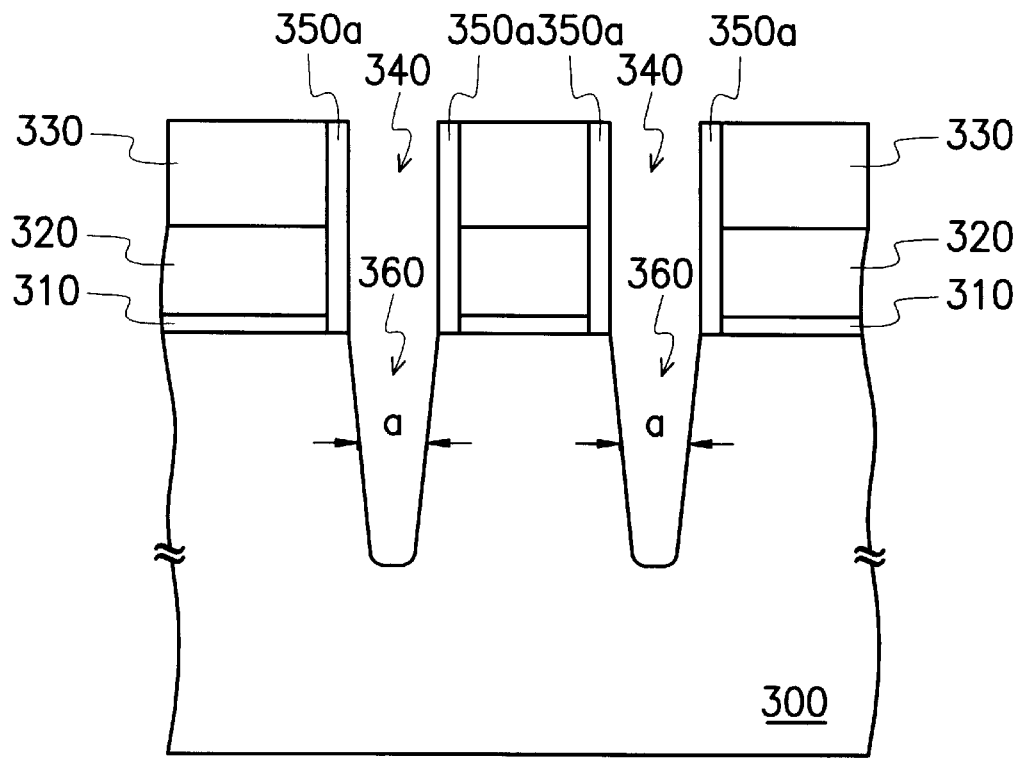

As shown in FIG. 3C, the sacrificial layer 350 above the second mask layer 330 is removed to retain a sacrificial layer 350a on the sidewalls of the first and second mask layer 320 and 330. Using the first mask layer 320, the second mask layer 330 and the sidewall sacrificial layer 350a as an etching mask, the substrate 300 is etched to form a trench 360.

The sacrificial layer 350 above the second mask layer 330 can be removed by an anisotropic dry etching. For example, if the sacrificial layer 350 is a polymeric material, oxygen plasma may be employed to reduce the organic compound to ashes. If the substrate 300 is a silicon substrate, the trench 360 can be formed, for example, by performing by a transformer coupled plasma (TCP) etching process. In a TCP etching process, gaseous reactants such as chlorine ($Cl_2$) or hydrogen bromide (HBr) and oxygen ($O_2$) are used. Typically, the gas flow rate of chlorine is about 80 to 120 sccm while the gas flow rate of oxygen is about 10 to 15 sccm, and the reaction chamber pressure is maintained between about 50 and 70 mtorrs. The TCP etching process is carried out using a power of 300 to 500 Watts and a bias voltage power of 200 to 300 Watts.

Figure 3D:
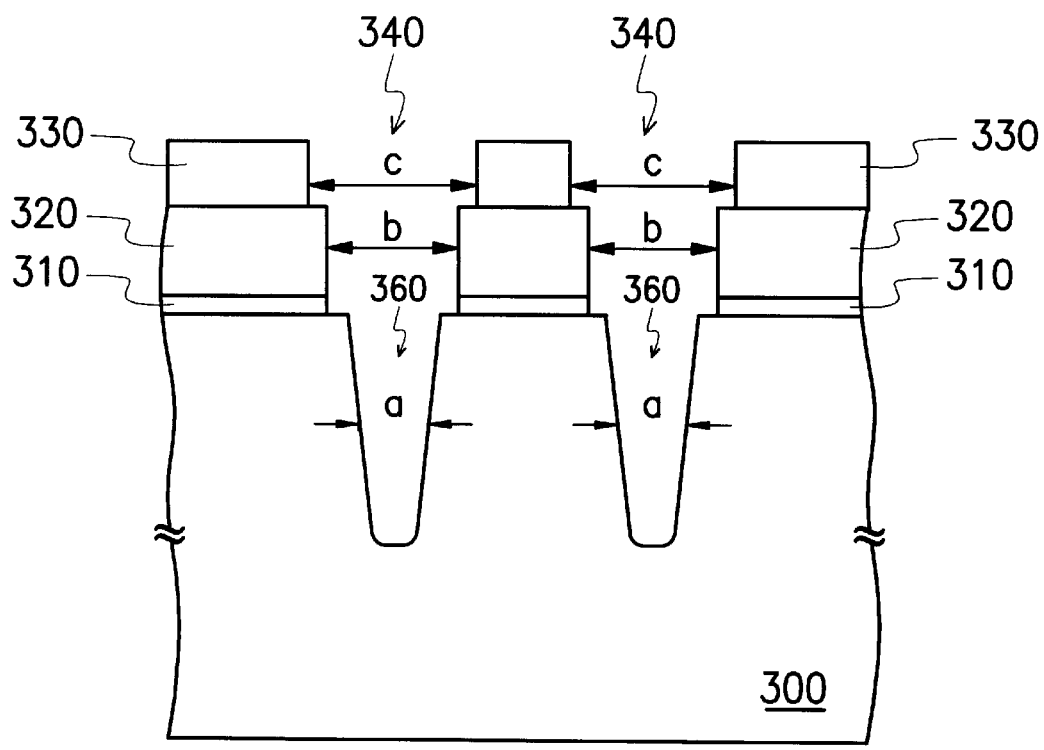

As shown in FIG. 3D, the sacrificial layer 350a is completely removed. An isotropic etching operation is carried out to remove a pre-defined thickness of the second mask layer 330, thereby opening up the opening above the trench 360 a little more. Hence, the trench 360 has a width of a, the opening in the first mask layer 320 has a width b and the opening in the second mask layer 330 has a width c. In other words, a staircase-like cross-sectional profile with increasing width (a<b<c) from the trench 360 to the opening 340 is formed. The formation of a wide-mouthed opening facilitates the subsequent deposition of insulating material such as silicon oxide into the STI trench. The sacrificial layer 350a, if made from a polymeric material, can be removed by, for example, oxygen plasma, hydrogen fluoride (HF) plasma or an acid. The second mask layer 330, if made from silicon oxide, can be removed by, for example, immersion in a hydrofluoric (HF) acid solution for a period of time.

FIGS. 4A through 4D are schematic cross-sectional views showing the progression of manufacturing steps for producing a pullback opening at the top of a STI trench according to a second preferred embodiment of this invention.

Figure 4A:
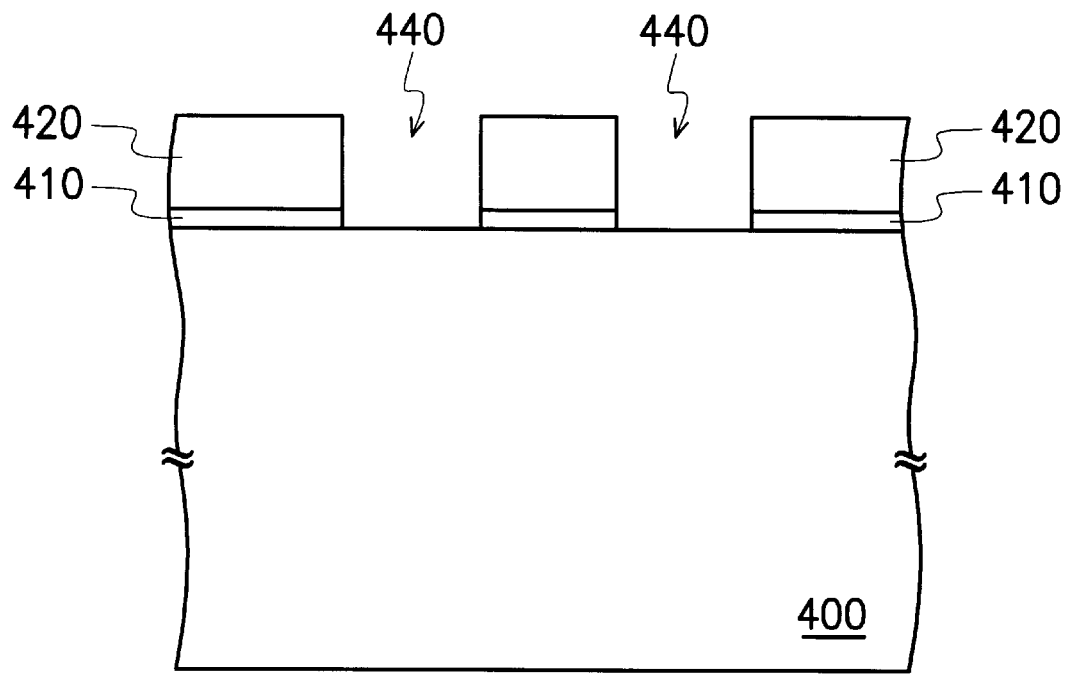
FIGS. 4A through 4D are schematic cross-sectional views showing the progression of manufacturing steps for producing a pullback opening at the top of a STI trench according to a second preferred embodiment of this invention.

As shown in FIG. 4A, a pad oxide layer 410 and a mask layer 420 are formed in sequence over a substrate 400. The pad oxide layer 410 and the mask layer 420 are patterned to form openings 440 by carrying out conventional photolithographic and etching processes.

The pad oxide layer 410 can be formed, for example, by thermal oxidation at a temperature above about 900° C. The mask layer 420 can be a silicon nitride layer formed, for example, by low pressure chemical vapor deposition (LPCVD) similar to the first embodiment of this invention.

Figure 4B:
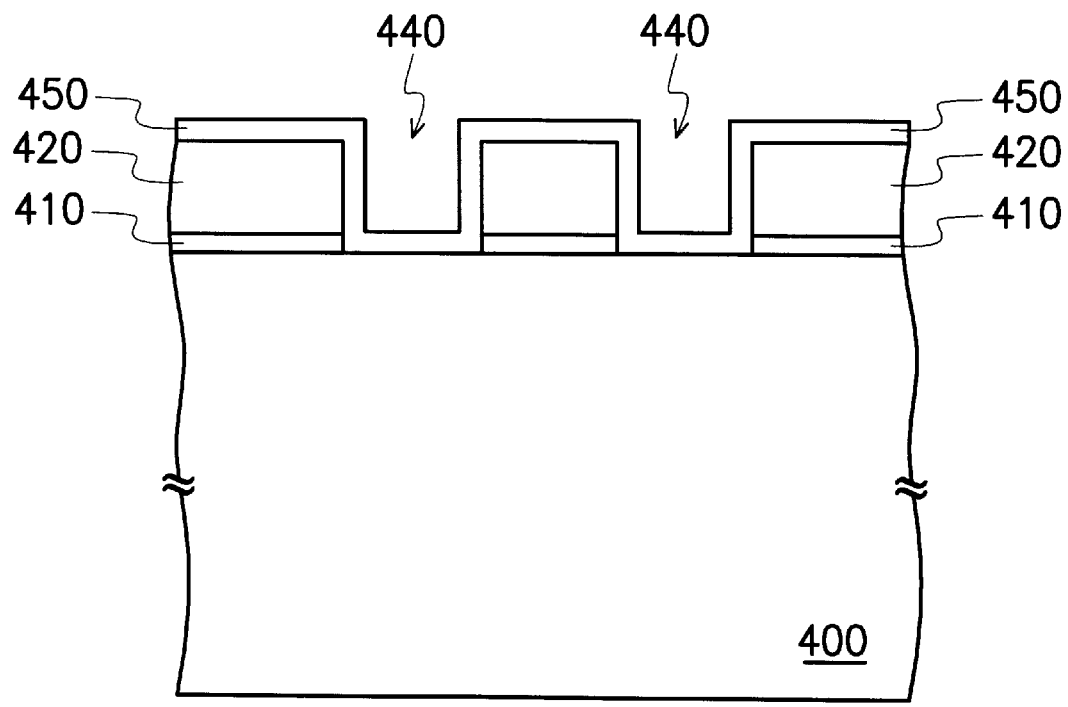

A conformal sacrificial layer 450 is formed over the exposed substrate 400, the pad oxide layer 410 and the mask layer 420 as shown in FIG. 4B. The sacrificial layer 450 is preferably formed using a material that differs from the substrate 400 and the mask layer 420 such as a polymer or silicon oxide. The polymeric or oxide sacrificial layer 350 is formed, for example, by inductively coupled plasma (ICP) chemical vapor deposition as described in the first embodiment.

Figure 4C:
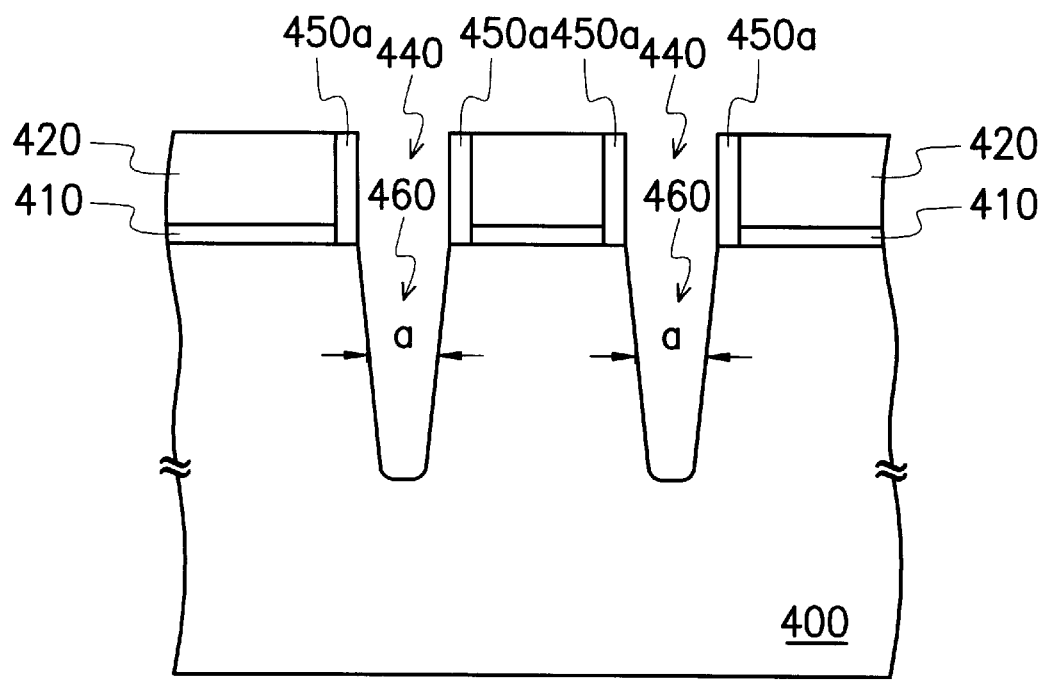

As shown in FIG. 4C, the sacrificial layer 450 above the mask layer 420 is removed to retain a sacrificial layer 450a on the sidewalls of the mask layer 420. Using the mask layer 420 and the sidewall sacrificial layer 450a as an etching mask, the substrate 400 is etched to form a trench 460. The sacrificial layer 450 above the mask layer 420 and substrate material 400 can be removed by an anisotropic dry etching method similar to the one used in the first embodiment.

Figure 4D:
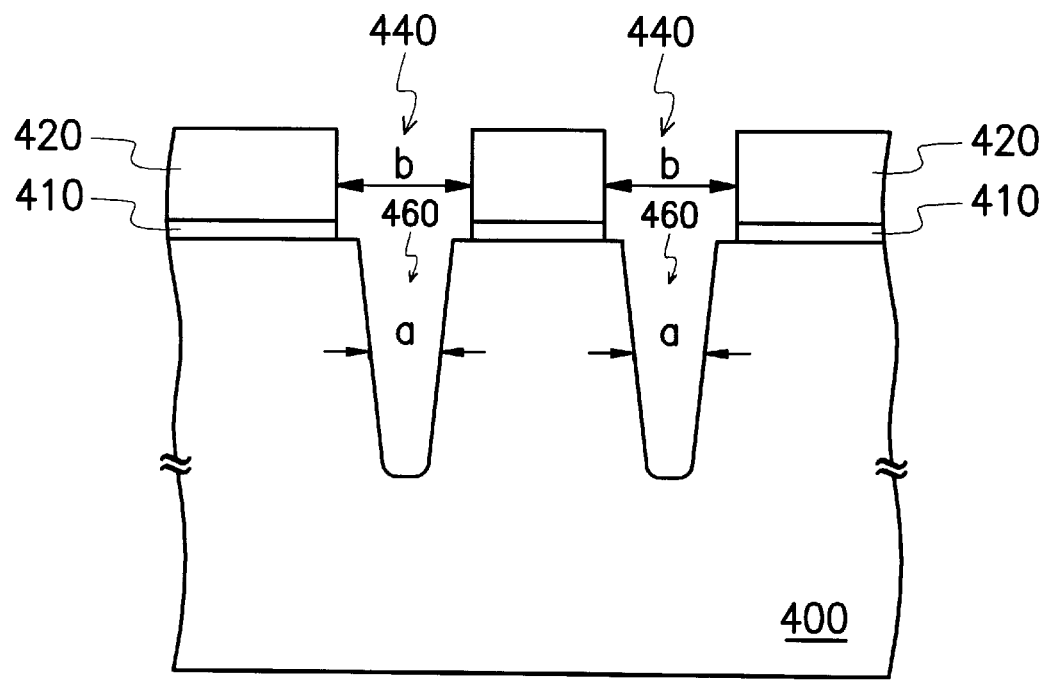

As shown in FIG. 4D, the sacrificial layer 450a is completely removed. Hence, the trench 460 has a width a and the opening in the mask layer 420 has a width b. In other words, a staircase-like profile with increasing width (a<b) from the trench 360 to the opening 440 is formed. The formation of a wide-mouthed opening facilitates the subsequent deposition of insulating material such as silicon oxide into the STI trench. The sacrificial layer 450a, if made from a polymeric material, can be removed, for example, by an acid or plasma such as oxygen or hydrogen fluoride (HF) plasma. However, if the sacrificial layer 450a is made from silicon oxide, it can be removed by carbon fluoride plasma or hydrofluoric acid solution.

In summary, the invention uses a mask layer and a sacrificial layer as an etching mask when the substrate is etched to form a trench. By removing the sacrificial layer after the trench-forming process, an opening having a pullback profile is formed over the trench. Since the pullback distance is the actual thickness of the sacrificial layer on the sidewalls of the opening, pullback distance can be precisely controlled.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a pullback opening above a shallow trench isolation structure, comprising the steps of:
   providing a substrate;
   forming a patterned mask layer over the substrate, wherein the mask layer includes depositing silicon nitride and then silicon oxide by chemical vapor deposition;
   forming a conformal cap layer over the substrate and the mask layer;
   removing a portion of the cap layer lying above the mask layer;
   etching the exposed substrate to form a trench in the substrate; and
   removing the cap layer.

2. The method of claim 1, wherein the silicon oxide layer of the mask layer is above the silicon nitride layer.

3. The method of claim 2, wherein after the step of removing the cap layer, further includes etching the silicon oxide layer of the composite mask layer with hydrofluoric acid (HF) solution to remove a pre-defined thickness of the silicon oxide layer from the sides of the opening.

4. The method of claim 1, wherein step of forming the cap layer includes deposition of polymeric material over the substrate and the mask layer by chemical vapor deposition.

5. The method of claim 4, wherein the deposition of polymeric material is carried out using a gaseous reactant difluoromethane ($CH_2F_2$) with a gas flow rate of about 10 to 150 sccm and a reaction chamber pressure of about 10 to 20 mtorrs.

6. The method of claim 5, wherein argon with a gas flow rate of about 1 to 200 sccm is used as a diluent for the gaseous reactant difluoromethane in the process of depositing polymeric material.

7. The method of claim 4, wherein an inductively coupled plasma chemical vapor deposition with a plasma power setting of about 400 to 700 Watts and electrode temperature setting of about 0 to 40° C. is used in the deposition of polymeric material.

8. The method of claim 1, wherein the cap layer includes a silicon oxide layer formed by chemical vapor deposition.

9. The method of claim 1, wherein the cap layer is made of a material having properties that differ from those of both the substrate and the mask layer.

10. A method for forming a pullback opening above a shallow trench isolation, comprising the steps of:
    providing a substrate;
    forming a patterned mask layer over the substrate;
    forming a sacrificial layer deposited with polymeric material on the sidewalls of the mask layer;
    etching the exposed substrate to form a trench in the substrate; and
    removing the sacrificial layer.

11. The method of claim 10, wherein the sacrificial layer is made of a material having properties that differ from those of both the substrate and the mask layer.

12. The method of claim 10, wherein the step of forming the mask layer includes depositing silicon nitride by chemical vapor deposition.

13. The method of claim 10, wherein the deposition of polymeric material is carried out using a gaseous reactant difluoromethane ($CH_2F_2$) with a gas flow rate of about 10 to 150 sccm and a reaction chamber pressure of about 10 to 20 mtorrs.

14. The method of claim 13, wherein argon with a gas flow rate of about 1 to 200 sccm is used as a diluent for the gaseous reactant difluoromethane in the process of depositing polymeric material.

15. The method of claim 10, wherein an inductively coupled plasma chemical vapor deposition method with a plasma power setting of about 400 to 700 Watts and electrode temperature setting of about 0 to 40° C. is used in the deposition of polymeric material.

* * * * *